United States Patent
Hsieh et al.

(10) Patent No.: US 8,274,270 B2
(45) Date of Patent: Sep. 25, 2012

(54) ADAPTIVE PULSE WIDTH CONTROL POWER CONVERSATION METHOD AND DEVICE THEREOF

(75) Inventors: Shun-An Hsieh, Jhongli (TW); Yu-Shen Lin, Taipei (TW)

(73) Assignee: Feeling Technology Corp., Hsinchu County (TW)

( * ) Notice: Subject to any disclaimer, the term of this patent is extended or adjusted under 35 U.S.C. 154(b) by 580 days.

(21) Appl. No.: 12/458,570

(22) Filed: Jul. 16, 2009

(65) Prior Publication Data

US 2011/0012658 A1 Jan. 20, 2011

(51) Int. Cl.
- G05F 1/56 (2006.01)
- G05F 1/565 (2006.01)
- G05F 1/569 (2006.01)
- G05F 1/575 (2006.01)

(52) U.S. Cl. ............... 323/283; 363/21.05; 363/21.13; 363/21.1; 363/21.18

(58) Field of Classification Search .......... 323/282–284; 363/21.04–21.05, 21.1, 21.11–21.13, 21.18
See application file for complete search history.

(56) References Cited

U.S. PATENT DOCUMENTS

| | | | |
|---|---|---|---|
| 6,489,756 B2 * | 12/2002 | Kanouda et al. | 323/284 |
| 6,959,750 B2 * | 11/2005 | Colson | 160/176.1 R |
| 7,417,879 B2 * | 8/2008 | Sawtell | 363/89 |
| 7,592,791 B2 * | 9/2009 | Emira | 323/283 |
| 7,605,576 B2 * | 10/2009 | Kanakubo | 323/285 |
| 2005/0007086 A1 * | 1/2005 | Morimoto | 323/282 |
| 2006/0273772 A1 * | 12/2006 | Groom | 323/284 |
| 2007/0159151 A1 * | 7/2007 | Katoh et al. | 323/285 |
| 2007/0257647 A1 * | 11/2007 | Chen et al. | 323/282 |
| 2008/0180078 A1 * | 7/2008 | Hiasa | 323/282 |
| 2008/0203989 A1 * | 8/2008 | Bacchi et al. | 323/284 |
| 2008/0225563 A1 * | 9/2008 | Seo | 363/123 |
| 2009/0079408 A1 * | 3/2009 | Qiao et al. | 323/283 |

* cited by examiner

*Primary Examiner* — Jeffrey Sterrett
*Assistant Examiner* — Nusrat Quddus
(74) *Attorney, Agent, or Firm* — Rosenberg, Klein & Lee

(57) ABSTRACT

An adaptive pulse width control power conversion device includes a pulse width adjustable pulse frequency module (PFM) control circuit, a pulse width modulation (PWM) control circuit, a PWM/PFM switching unit, a switching circuit, and a load status detection circuit. When the power conversion device is to be switched from a PWM mode to a PFM mode, pulse width of a series of PFM control signals is sequentially adjusted from a low value to a high value according to a predetermined pulse width increment until an optimum pulse width is determined and thereafter, an output voltage is supplied to a load in the PFM mode, whereby ripple of output voltage in the PFM mode can be improved and improved stability of output of the power conversion device is realized.

10 Claims, 7 Drawing Sheets

ADAPTIVE PULSE WIDTH CONTROL POWER CONVERSATION METHOD AND DEVICE THEREOF

FIELD OF THE INVENTION

The present invention relates to a power conversion device, and in particular to an adaptive pulse width control power conversion method and a device thereof.

BACKGROUND OF THE INVENTION

In the current electronic and/or computer system that is getting complicated and sophisticated, a power conversion device plays a very important role. Referring to FIG. 1 of the attached drawings, a control circuit diagram of a conventional power conversion device is shown. The conventional power conversion device, generally designated at 100, comprising a control logic circuit 1 that generates a series of pulse control signals Pout1 to control a switching circuit 2 to generate a series of switching circuit output signals LX1 by conducting on/off semiconductor devices (such as metal oxide semiconductor field effect transistors (MOSFETs) of the switching circuit 2 and then a filter circuit 21 is employed to convert an input voltage source Vin into an output voltage Vout1 for a load 3.

The control logic circuit 1 operates for output control with pulse width modulation (PWM). The PWM control features synchronization of a switching frequency of the switching circuit 2 with a system clock signal CLK and power conversion is realized through modulation of the pulse width of the pulse control signal Pout1. The modulation of the pulse width is based on feedback status signals of inductor current iL1 and output voltage Vout1. For example, an inductor current detection circuit 41, an error amplifier circuit 42, and a comparator 43 (that provides a slope compensation signal Vs) shown in the drawing constitute a feedback circuit of the output voltage Vout1. The inductor current detection circuit 41 functions to detect the inductor current iL1. The error amplifier circuit has an input terminal that is supplied with a reference voltage Vref and another input terminal that receives an input of the output voltage Vout1 supplied to the load 3. The comparator 43 compares outputs from the error amplifier circuit 42 and the inductor current detection circuit 41 and generates a feedback signal Fb that is fed back to the control logic circuit 1.

Besides PWM control, power conversion devices also adopt pulse frequency modulation (PFM) for power conversion. The PFM control features controlling switching frequency of a switching circuit and the switching frequency of the switching circuit is adjusted according to the difference of voltage conversion ratio or load. In case of high voltage conversion ratio and large load, the switching frequency of the switching circuit is increased, and in low voltage conversion ratio and small load, the switching frequency of the switching circuit is decreased. Compared to the PWM control, the PFM control maintains a fixed pulse width of the pulse control signal regardless of the voltage conversion ratio, the load, and variations of external devices, such as an inductor L and a capacitor C.

Generally speaking, for a power conversion device operated with PFM control, the efficiency of power conversion is high for light loading. When the lose of power for switching of the switching device is kept fixed, the ratio of the power lose of switching of the switching device with respect to output power is inversely proportional to the load. Thus, in light loading, a major portion of power lose occurs for the switching operation of the switching circuit. The PFM control reduces the switching frequency in light loading so that the power lose occurring for switching operation is reduced. Relatively speaking, the PFM control is of better efficiency in light loading than the PWM control, and the PWM control gets lowered conversion efficiency for light loading. Thus, the state-of-the-art power conversion device adopts an operation mode of combining PWM and PFM and switches from PWM control to PFM control in a light loading condition. FIGS. 2 and 3 respectively show waveforms of inductor current iL11, output voltage Vout11, and switching circuit output signal LX11 in a PWM mode and those of inductor current iL12, output voltage Vout12, and switching circuit output signal LX12 in a PFM mode.

SUMMARY OF THE INVENTION

However, for a conventional power conversion device that switches from a PWM mode to a PFM mode in a light loading condition, since the pulse width of the pulse control signal is fixed regardless of voltage conversion ratio, load, and external devices (such as inductor and capacitor), the ripple of output voltage in the PFM mode (see FIG. 3) is greater than the output voltage ripples of the PWM mode (see FIG. 2) and the output voltage ripple increases with the decreasing voltage conversion ratio. This is a major problem of the power conversion devices of this type.

Thus, an objective of the present invention is to provide an adaptive pulse width control power conversion method and a device thereof, which lower ripple of output voltage in a PFM mode and provide better stability of output.

The solution adopted in the present invention to overcome the problems of the conventional techniques comprises generating a series of PFM control signals in accordance with a predetermined pulse width upon detecting a mode switching event signal, comparing pulse widths of a PFM control signal and a PWM control signal and supplying a larger one of the pulse widths as an output of a pulse width control signal based on which a switching circuit is controlled, and a filter circuit then supplying an output voltage to a load. Pulse width of the PFM control signal is sequentially adjusted from a low value to a high value according to a predetermined pulse width increment, and based on detection of a feedback status signal of the load, the pulse width of the PFM control signal is set to an optimum pulse width for supplying an output voltage to the load in the PFM mode.

A circuit in accordance with the present invention comprises a pulse width adjustable PFM control circuit that generates a series of PFM control signals, a PWM control circuit that generates a series of PWM control signals, a PWM/PFM switching unit that is connected between the pulse width adjustable PFM control circuit and the PWM control circuit, a switching circuit that is connected to an input voltage source and the pulse width adjustable PFM control circuit, and a load status detection circuit that detects a feedback status signal.

In accordance with the technique solutions of the present invention, when the power conversion device is to be switched from a PWM mode to a PFM mode, based on different voltage conversion ratio and external devices, and according to feedback status signals of inductor current and output voltage of a load, the pulse width of a PFM control signal is adjusted to an optimum pulse width, whereby when the power conversion device works in the PFM mode, the ripple of the output voltage thereof is improved and increase of the ripple of the output voltage due to decreased voltage conversion ratio is eliminated so as to reduce power lose in switching and maintain excellent stability of output.

BRIEF DESCRIPTION OF THE DRAWINGS

The present invention will be apparent to those skilled in the art by reading the following description of preferred embodiment of the present invention and the best mode for carrying out the present invention, with reference to the attached drawings, in which.

DETAILED DESCRIPTION OF THE PREFERRED EMBODIMENTS

Figure 4:
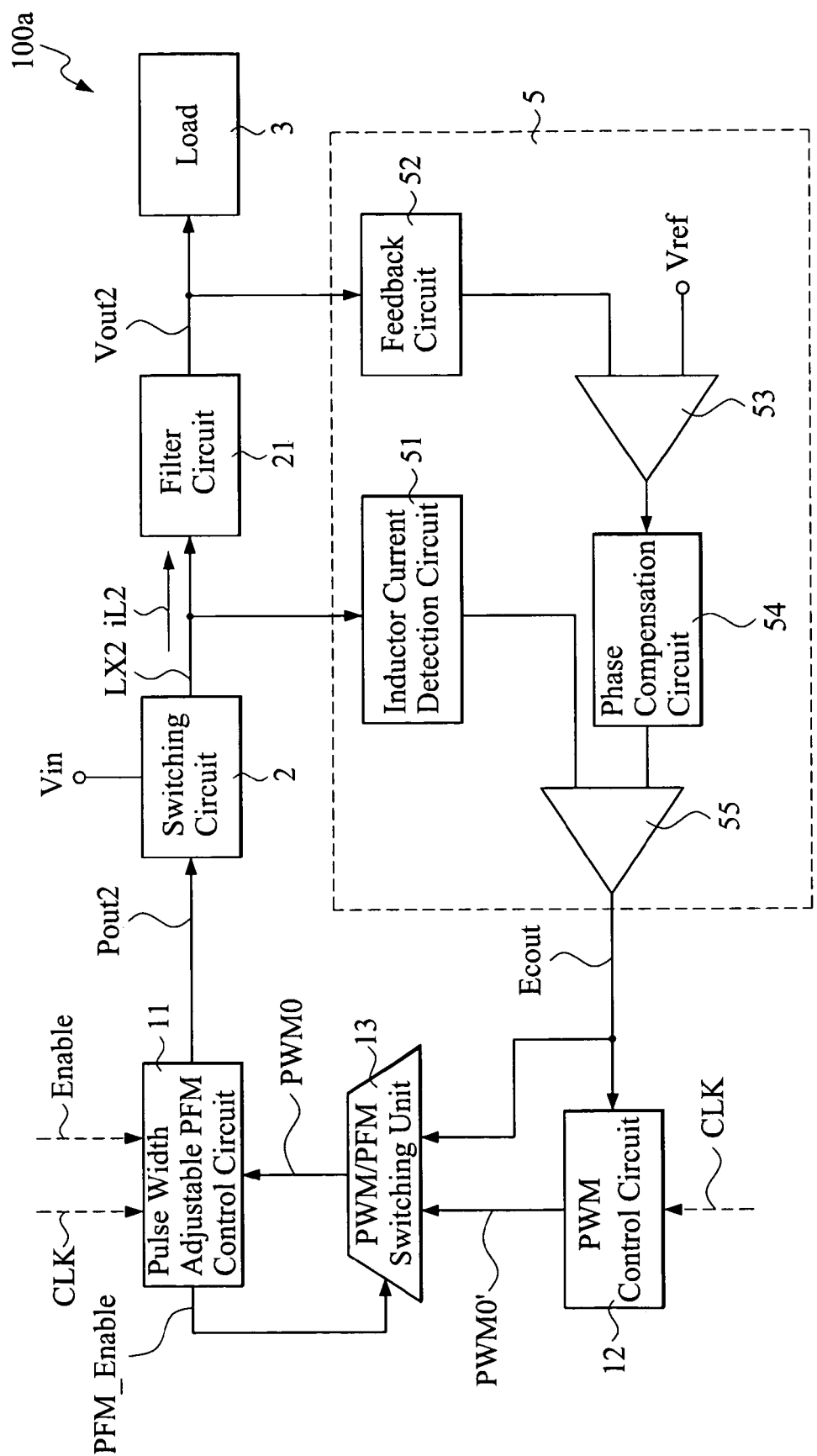
FIG. 4 shows a control circuit diagram of a preferred embodiment in accordance with the present invention.
Figure 5:
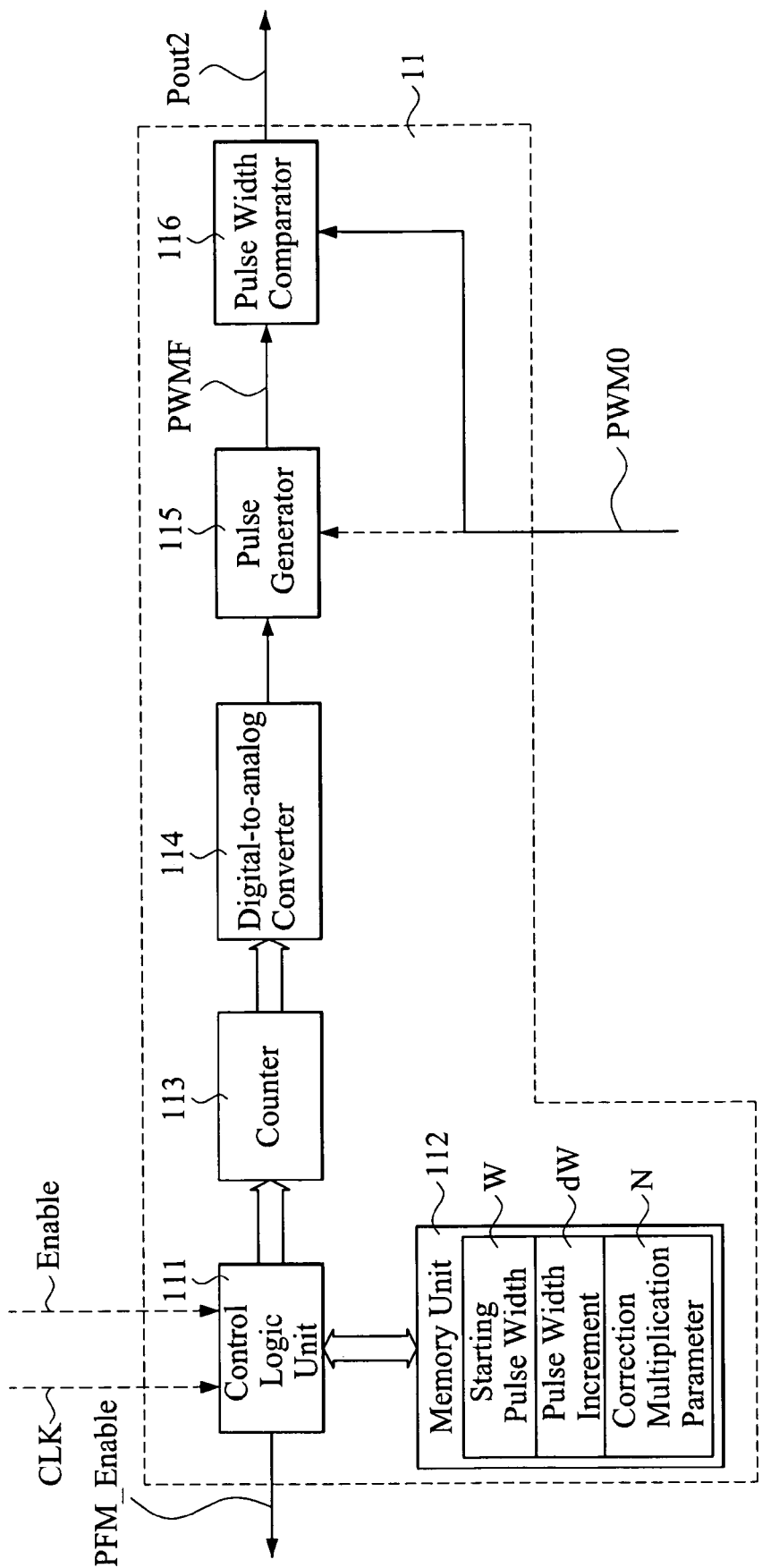
FIG. 5 shows a control circuit diagram of a pulse width adjustable PFM control circuit of the preferred embodiment in accordance with the present invention.

With reference to the drawings and in particular to FIGS. 4 and 5, an adaptive pulse width control power conversion device 100a in accordance with the present invention comprises a control circuit that comprises a pulse width adjustable pulse-frequency modulation (PFM) control circuit 11, a pulse-width modulation (PWM) control circuit 12, a PWM/PFM switching unit 13, a switching circuit 2, and a load status detection circuit 5.

The pulse width adjustable PFM control circuit 11 is connected to the PWM control circuit 12 by the PWM/PFM switching unit 13. As shown in FIG. 5, the pulse width adjustable PFM control circuit 11 comprises a control logic unit 111, which is connected to a memory unit 112. The memory unit 112 stores therein a starting value of pulse width W, a pulse width increment dW, and a correction multiplication parameter N, based on which the control logic unit 111 controls, sequentially through a counter 113 and a digital-to-analog converter 114, a pulse generator 15 to supply a series of PFM control signals PWMF to a pulse width comparator 116. It is noted that for those having ordinary skills in the art, using a counter 113 to generate PFM control signals PWMF is only an example that is currently considered the best mode in carrying out the present invention and other ways may be equally used.

The PWM control circuit 12 generates a series of PWM control signals PWM0', which are applied through the PWM/PFM switching unit 13 to the pulse width comparator 116 of the pulse width adjustable PFM control circuit 11. The pulse width comparator 116 compares the PFM control signal PWMF and the PWM control signal PWM0 to identify and supply one of the PFM control signal PWMF and the PWM control signal PWM0 that has a larger pulse width as an output of a pulse width control signal Pout2.

The switching circuit 2 is connected to an input voltage source Vin and the pulse width adjustable PFM control circuit 11. The switching circuit 2 is controlled by the pulse width control signal Pout2 to generate a series of switching circuit output signals LX2, so as to supply, through a filter circuit 21, an output voltage Vout2 to a load 3.

The load status detection circuit 5 detects voltage and current of the load 3 and generates a feedback status signal Ecout to the PWM control circuit 12 and the PWM/PFM switching unit 13. In the instant embodiment, the load status detection circuit 5 comprises an inductor current detection circuit 51, a feedback circuit 52, an error amplifier circuit 53, a phase compensation circuit 54, and a difference comparison circuit 55.

The inductor current detection circuit 51 is connected to a node between the switching circuit 2 and the filter circuit 21 to detect an inductor current iL2 supplied to the load 3. The feedback circuit 52 is connected to a node between the filter circuit 21 and the load 3 to detect the output voltage Vout2 supplied to the load 3. The error amplifier circuit 53 has an input terminal that is supplied with a reference voltage Vref and another input terminal that is connected to the feedback circuit 52 and an output terminal connected through the phase compensation circuit 54 to an input terminal of the difference comparison circuit 55. Another input terminal of the difference comparison circuit 55 is connected to the inductor current detection circuit 51, and an output terminal of the difference comparison circuit 55 supplies an output, which is applied to the PWM control circuit 12 and is also applied, through the PWM/PFM switching unit 13, to the pulse width adjustable PFM control circuit 11.

Figure 6:
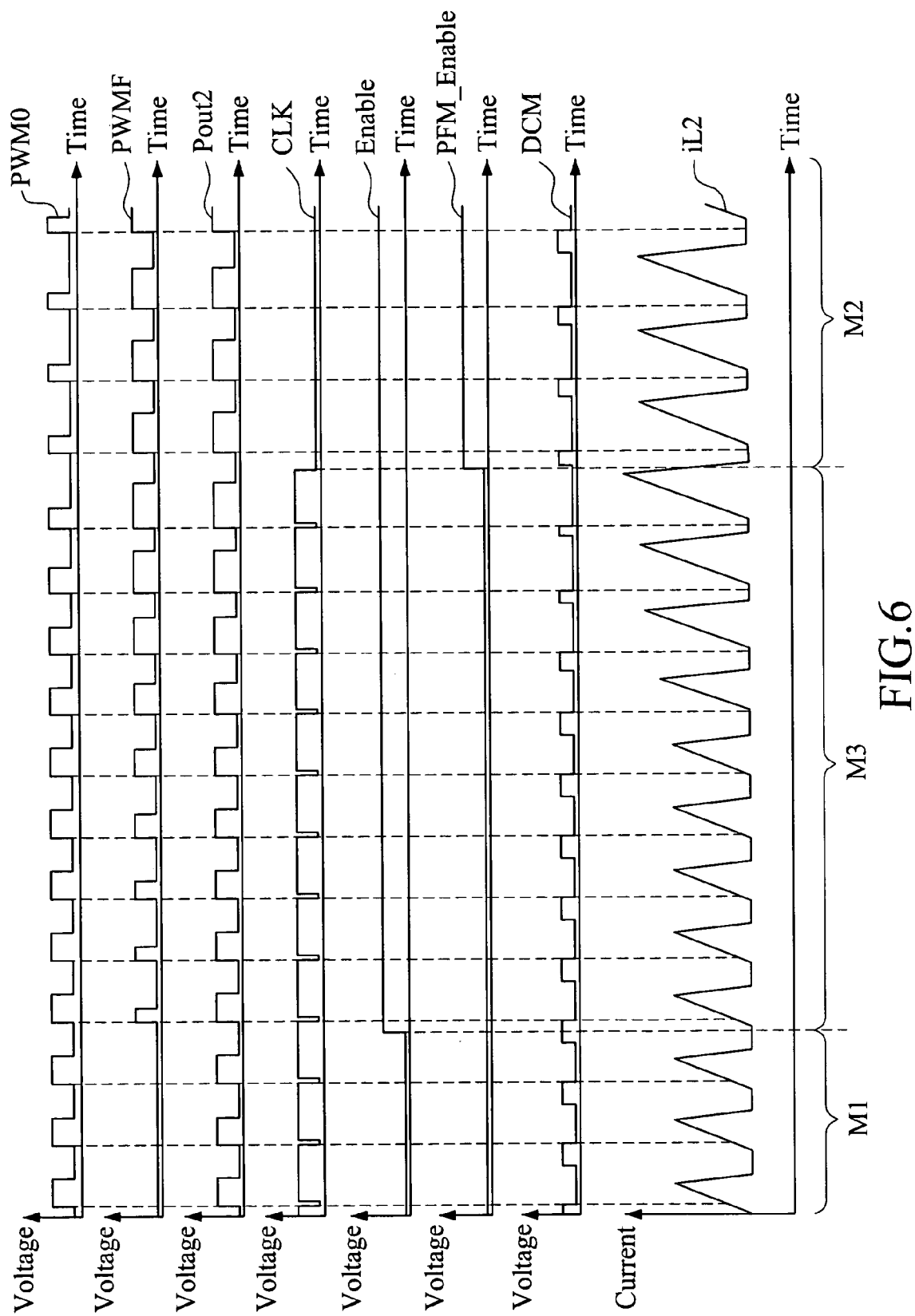
FIG. 6 shows a waveform diagram of signals associated with circuits of the present invention.

Also referring to FIG. 6, a waveform diagram of signals associated with each circuit of the present invention is shown, illustrating variation of waveforms of the PWM control signal PWM0, the PFM control signal PWMF, the pulse width control signal Pout2, a clock signal CLK, a mode switching event signal Enable, a PFM mode switching event signal PFM_Enable, a discontinuous current mode signal DCM, and the inductor current iL2 when the device switches from a PWM mode M1 into a PFM mode M2.

Figure 7:
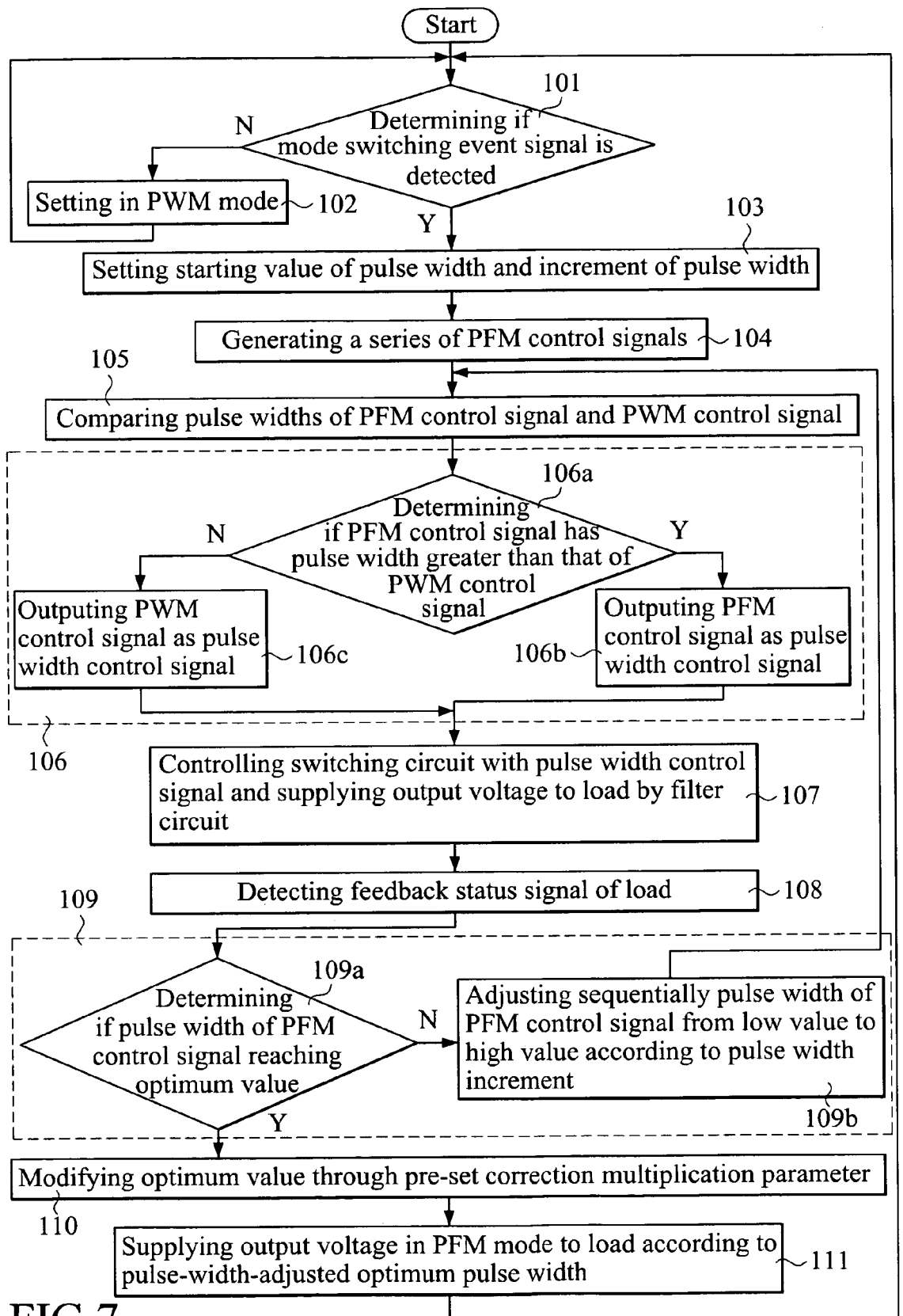
FIG. 7 shows a flowchart of an operation process of the best mode in accordance with the present invention.

FIG. 7 shows a flowchart of an operation process of the best mode in accordance with the present invention. Also referring to FIGS. 4-6, an explanation of the operation process of the best mode of the present invention will be given. The adaptive pulse width control power conversion device 100a in accordance with the present invention is switchable between the PWM mode M1 and the PFM mode M2 and when the adaptive pulse width control power conversion device 100a is switched from the PWM mode M1 to the PFM mode M2, a transition phase M3 is present to adjust a pulse width of the PFM control signal PWMF to an optimum value.

In a practical operation, firstly, the pulse width adjustable PFM control circuit 11 determines if a mode switching event signal Enable is detected (Step 101). The mode switching event signal Enable is generated when the load 3 is set with a light loading. Those having ordinary skills are fully aware that light loading can be identified by for example inspecting current, voltage, and pulse width of a pulse width control signal. The mode switching event signal Enable can be generated externally or internally. In a normal loading, such as an intermediate loading or a heavy loading, the adaptive pulse width control power conversion device 100a is set in PWM mode M1 (Step 102) and the PWM control circuit 12, based on the input signal Ecout and CLK, generates a series of PWM control signals PWM0, serving as an output of a pulse width control signal Pout2.

When a mode switching event signal Enable is detected, meaning the loading is changed to a light one, the adaptive pulse width control power conversion device 100a is switched from the PWM mode M1 to the transition phase M3, wherein the pulse width adjustable PFM control circuit 11 sets a starting value W of pulse width and an increment dW of pulse width (Step 103). In the instant embodiment, the starting pulse width W and the pulse width increment dW are pre-loaded in the memory unit 112. However, it is apparent that they can be supplied from an external device through other means.

Further, the PWM control circuit 12 continuously applies the PWM control signals PWM0 generated thereby to the pulse width adjustable PFM control circuit 11. The control logic unit 111 of the pulse width adjustable PFM control circuit 11, based on the starting pulse width W, generates a series of PFM control signals PWMF (Step 104), wherein the PFM control signal PWMF is triggered by a leading edge of the PWM control signal PWM0 so as to be made synchronous with the PWM control signal PWM0 and both are applied to the pulse width comparator 116.

The PFM control signal PWMF and the PWM control signal PWM0, after being fed to the pulse width comparator 116, are compared by the pulse width comparator 116 in respect of the pulse widths thereof (Step 105), whereby the one of the PFM control signal PWMF and the PWM control signal PWM0 that has a large pulse width is outputted as the pulse width control signal Pout2 (Step 106). In particular, the step (Step 106) is performed by first determining if the PFM control signal PWMF has a pulse width greater than a pulse width of the PWM control signal PWM0 (Step 106a). When the pulse width of the PFM control signal PWMF is larger, the PFM control signal PWMF is outputted as the pulse width control signal Pout2 (Step 106b); when the pulse width of the PWM control signal PWM0 is larger, the PWM control signal PWM0 is outputted as the pulse width control signal Pout2 (Step 106c). Although in the best mode of the present invention, the above steps are taken to provide the pulse width control signal Pout2, it is apparent that the PWM control signal PWM0 can be taken as a reference, which is then successively incremented until a similar result of output of the pulse width control signal Pout2 is done.

The pulse width adjustable PFM control circuit 11 controls the switching circuit 2 with the pulse width control signal Pout2 and the filter circuit 21 then supplies an output voltage Vout2 to the load 3 (Step 107). The load status detection circuit 5 may then detect a feedback status signal Ecout of the load 3 (Step 108), which is fed back to the PWM/PFM switching unit circuit 13. In the embodiment illustrated, the feedback status signal Ecout comprises the inductor current iL2 and the output voltage Vout2 supplied to the load 3.

The feedback status signal Ecout fed back from the load status detection circuit 5 functions to adjust the PFM control signal PWMF and the PWM control signal PWM0. As shown in FIG. 6, based on the feedback status signal Ecout, the PWM control circuit 12 gradually reduces the pulse width of the PWM control signal PWM0 when the loading is changed to a light loading. The pulse width adjustable PFM control circuit 11, based on the pre-set pulse width increment dW, sequentially adjusts the pulse width of the PFM control signal PWMF from a low value to a high value and sets an optimum value in accordance with the feedback status signal Ecout (Step 109). In particular, in the step (Step 109), it is first determined if the pulse width of PFM control signal PWMF reaches the optimum value or not (Step 109a) and if the pulse width of the PFM control signal PWMF has not yet reached the optimum value, then the control logic unit 111 sequentially adjusts the pulse width of the PFM control signal PWMF from a low value to a high value in accordance with pulse width increment dW (Step 109b), whereby the pulse width of the PFM control signal PWMF successively incremented with the clock signal CLK and through repeated cycles of output, detection, and adjustment, the optimum value can be reached.

Identification of the pulse width of the PFM control signal PWMF reaching the optimum pulse width can be done with detection of the inductor current iL2, the output voltage Vout2 ripple, and the variation of the load 3, and the following processes can be used: (1) detecting if the inductor current supplied to the load changes from a discontinuous current mode (DCM) to a continuous current mode (CCM), detection time point being the end of a cycle of the clock signal CLK or $\frac{1}{10}$ to 1 cycle of the clock signal CLK, detection current being from zero to two times of the current of the DCM/CCM boundary; (2) detecting if ripple of the output voltage supplied to the load is greater than ripple of the output voltage at the DCM/CCM boundary; and (3) detecting if an average of the inductor current supplied to the load is greater than an average of the inductor current when working at the DCM/CCM boundary. In this way, the optimum pulse width can be determined respectively for different conditions in respect of various voltage conversion ratios and variants of external devices.

After the optimum pulse width is obtained, it may be feasible to further carry out modification of the optimum value through a pre-set correction multiplication parameter N (Step 110) so as to increase or decrease the optimum value in consideration of different loads and circuits. In case that the optimum pulse width is increased, the ripple of output voltage is increased and the efficiency is improved. If the optimum pulse width is decreased, then the ripple of output voltage is decreased and the efficiency is lowered. Once the optimum pulse width is set, the set value of the optimum pulse width is locked and the pulse width adjustable PFM control circuit 11 applies the PFM mode switching event signal PFM_Enable to the PWM/PFM switching unit 13 to switch to the PFM mode M2. Subsequently, the output voltage Vout2 is supplied in the PFM mode M2 to the load 3 according to the pulse-width-adjusted optimum pulse width (Step 111) and the feedback status signal Ecout serves for adjusting the pulse frequency of the PFM control signal PWMF.

Figure 1:
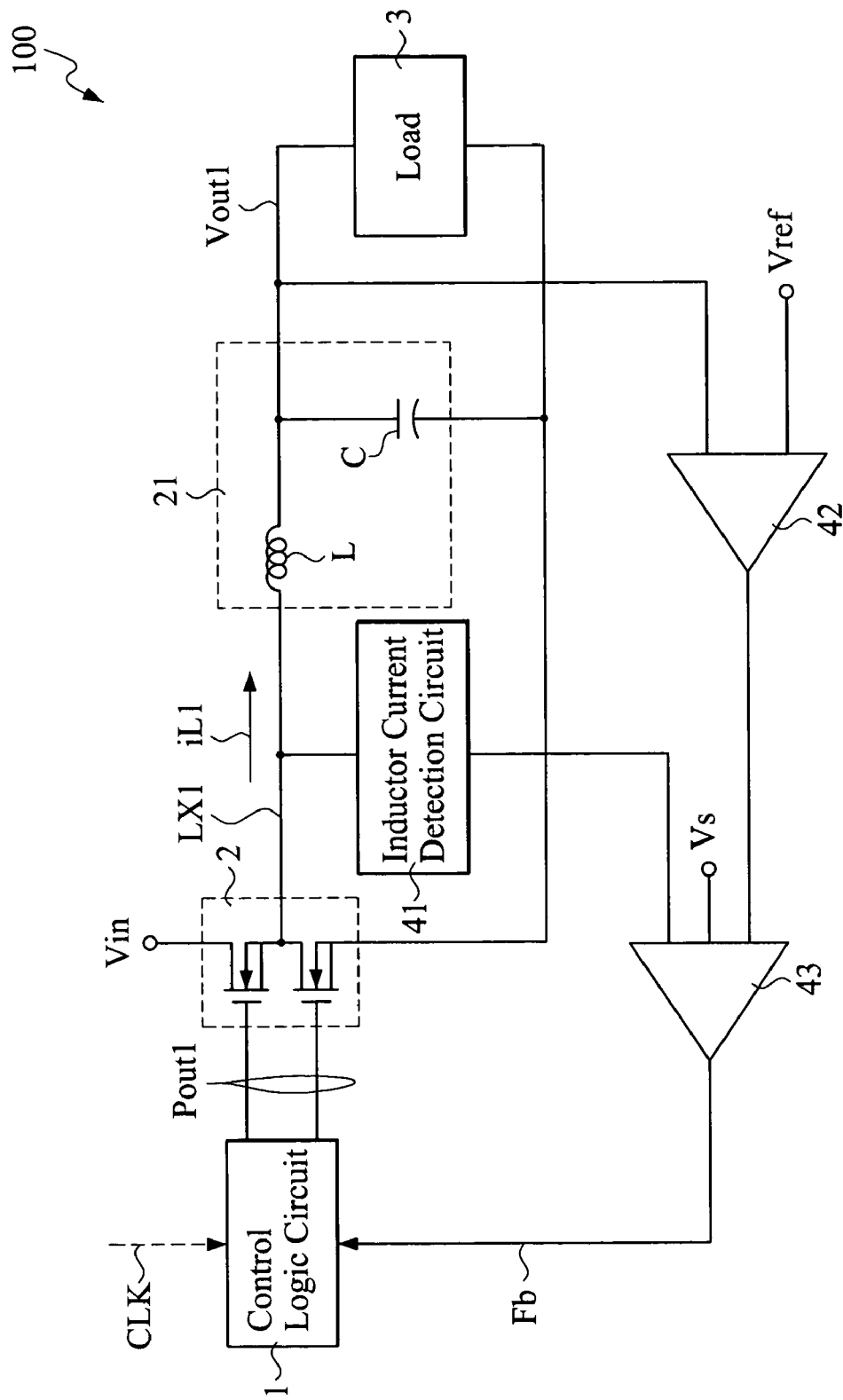
FIG. 1 shows a control circuit diagram of a conventional power conversion device.
Figure 2:
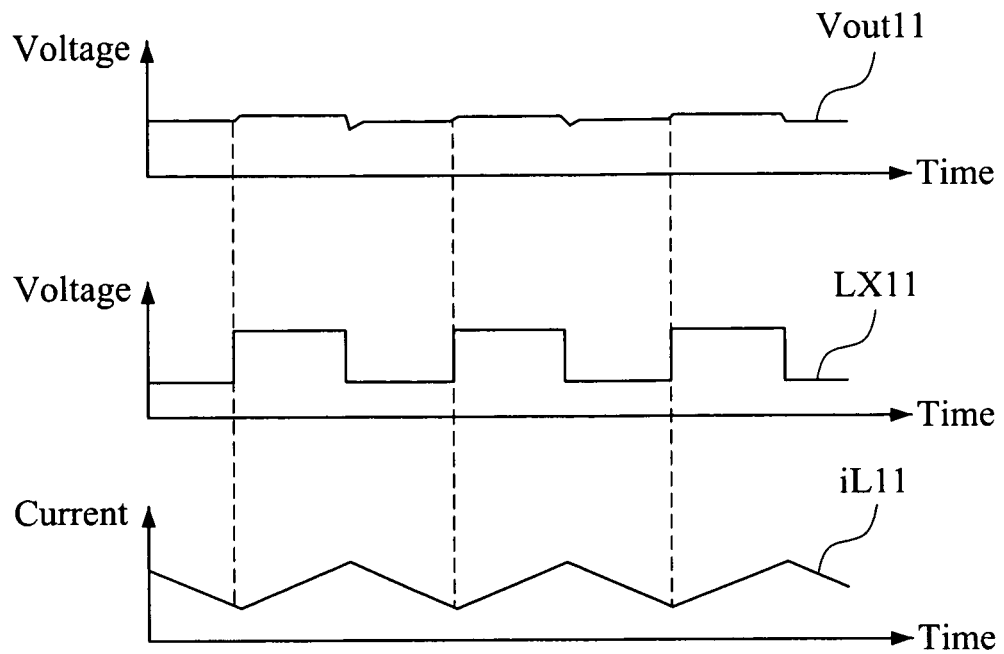
FIG. 2 shows waveforms of signals from various circuits of the conventional power conversion device in a pulse width modulation (PWM) mode.
Figure 3:
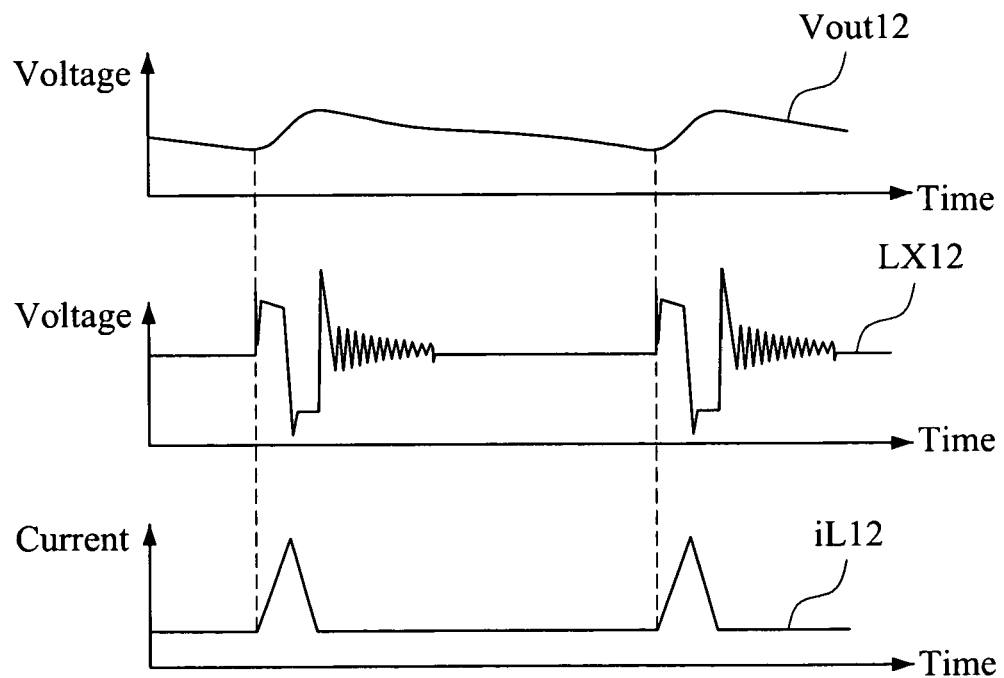
FIG. 3 shows waveforms of signals from various circuits of the conventional power conversion device in a pulse frequency modulation (PFM) mode.
Figure 8:
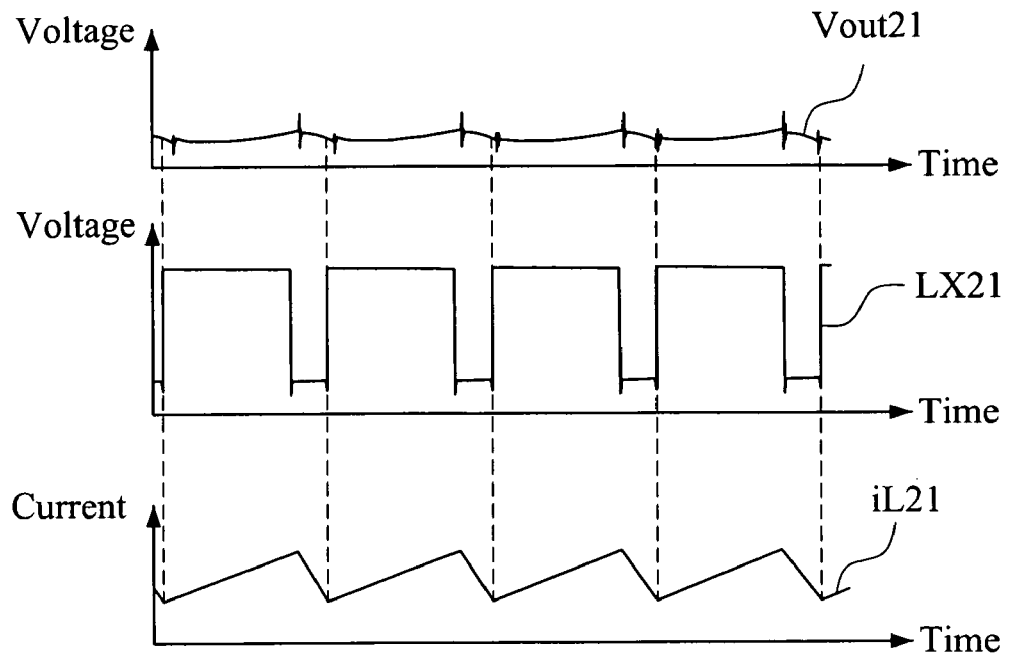
FIG. 8 shows waveforms of signals from various circuits in a PWM mode in accordance with the present invention.
Figure 9:
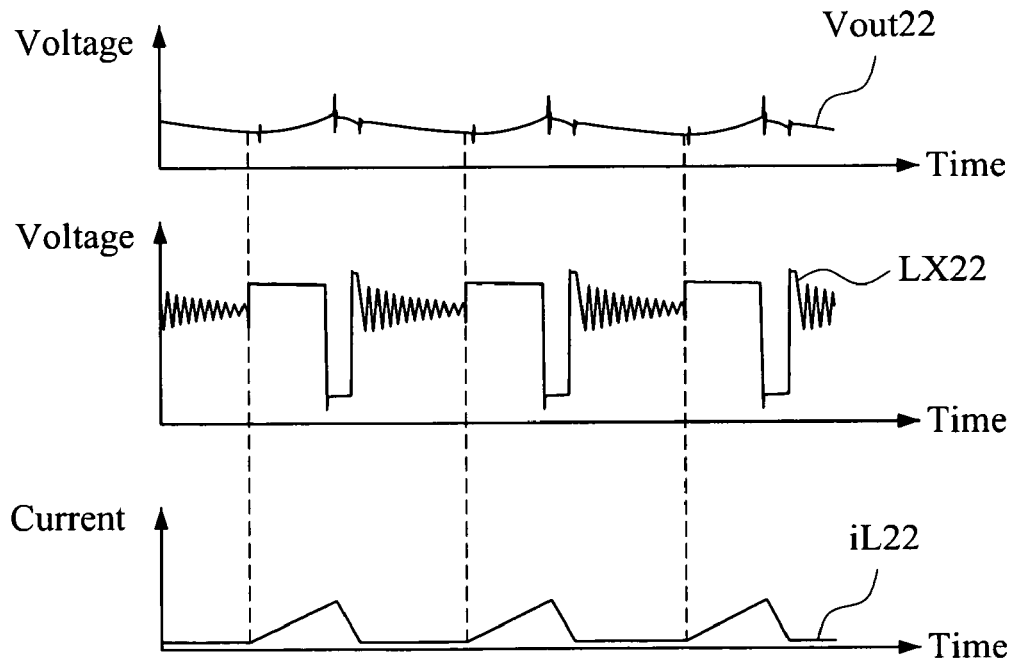
FIG. 9 shows waveforms of signals from various circuits in a PFM mode in accordance with the present invention.

Referring to FIGS. 8 and 9, FIG. 8 shows waveforms of the inductor current iL21, the output voltage Vout21, and the switching circuit output signal LX21 in the PWM mode in accordance with the present invention and FIG. 9 shows waveforms of the inductor current iL22, the output voltage Vout22, and the switching circuit output signal LX22 in the PFM mode in accordance with the present invention. Compared to the known techniques (see FIGS. 2 and 3), the present invention additionally carries out pulse width adjustment of the PFM control signal PWMF before entering the PFM mode and this makes it possible to obtain the optimum pulse width. Thus, in the PFM mode of the present invention, the ripple of the output voltage Vout22 is not greater than the ripple of the output voltage Vout21 of the PWM mode, so that the drawbacks of the known techniques can be improved.

Although the present invention has been described with reference to the preferred embodiment thereof and the best mode for carrying the invention, it is apparent to those skilled in the art that a variety of modifications and changes may be made without departing from the scope of the present invention which is intended to be defined by the appended claims.

What is claimed is:

1. An adaptive pulse width control power conversion method, wherein an input power source is converted by an adaptive pulse width control power conversion circuit into an output voltage supplied to a load, the power conversion circuit being switchable between a pulse frequency module (PFM) mode and a pulse width modulation (PWM) mode, the method comprising the following steps:
   (a) detecting a mode switching event signal;
   (b) upon detecting the mode switching event signal, the power conversion circuit generating a series of PFM control signals in accordance with a predetermined pulse width so as to supply a pulse width control signal;
      (b1) comparing pulse width of the PFM control signal and pulse width of a pulse width modulation (PWM) control signal generated by the power conversion circuit;
      (b2) identifying and supplying a greater one of the pulse widths of the PFM control signal and the PWM control signal as an output of the pulse width control signal;
   (c) using the pulse width control signal to control a switching circuit and employing a filter circuit to supply an output voltage to the load;
   (d) detecting a feedback status signal of the load;
   (e) sequentially adjusting pulse width of the PFM control signal from a low value to a high value according to a predetermined pulse width increment, and determining an optimum pulse width according to the feedback status signal; and
   (f) supplying the output voltage to the load in the PFM mode according to the pulse width adjusted optimum pulse width.

2. The method as claimed in claim 1, wherein in step (a), the mode switching event signal is generated when the load is light loading.

3. The method as claimed in claim 1, wherein in step (e), the optimum pulse is determined according to if an inductor current supplied to the load changes from a discontinuous current mode to a continuous current mode.

4. The method as claimed in claim 1, wherein in step (e), the optimum pulse width is determined according to if ripple of an output voltage supplied to the load is greater than ripple of an output voltage at the boundary between the discontinuous current mode and the continuous current mode.

5. The method as claimed in claim 1, wherein in step (e), the optimum pulse width is determined according to if an average of an inductor current supplied to the load is greater than an average of an inductor current at the boundary between the discontinuous current mode and the continuous current mode.

6. The method as claimed in claim 1 further comprising, after step (e), a step of modification of the optimum value through a pre-set correction multiplication parameter.

7. An adaptive pulse width control power conversion device, through which an input voltage source is subjected to conversion and supplied to a load, the device comprising:
   a pulse width adjustable pulse frequency modulation (PFM) control circuit, which generates a series of PFM control signals;
   a pulse width modulation (PWM) control circuit, which generates a series of PWM control signals;
   a PWM/PFM switching unit, which connects between the pulse width adjustable PFM control circuit and the PWM control circuit;
   a switching circuit, which is connected to the input voltage source and the pulse width adjustable PFM control circuit, the switching circuit being controlled by a pulse width control signal that is an output of one of the PFM control signal and the PWM control signal, a filter circuit supplying an output voltage to the load; and
   a load status detection circuit, which detects a feedback status signal of the load and applies the feedback status signal to the pulse width adjustable PFM control circuit and the PWM control circuit;
   wherein when the power conversion device is to be switched from a PWM mode to a PFM mode, the pulse width adjustable PFM control circuit generates a series of PFM control signals according to a predetermined pulse width and pulse width of the PFM control signal is sequentially adjusted from a low value to a high value according to a predetermined pulse width increment until an optimum pulse width is determined in accordance with the feedback status signal, and thereafter, the output voltage is supplied to the load in the PFM mode according to the pulse width adjusted optimum pulse width;
   wherein the pulse width adjustable PFM control circuit comprises:
   a control unit;
   a memory unit, which is connected to the control unit, the memory storing the pulse width increment;
   a pulse generator, which is connected to the control unit and is controlled by the control unit to generate the PFM control signal; and
   a pulse width comparator, which is connected to the pulse generator to compare and identify a greater one of pulse widths of the PFM control signal and the PWM control signal as an output of the pulse control signal.

8. The adaptive pulse width control power conversion device as claimed in claim 7, wherein the pulse width adjustable PFM control circuit comprises a counter and a digital-to-analog converter, the counter being connected to the control unit, the digital-to-analog converter being connected to the counter, the control unit using the counter and the digital-to-analog converter to control the pulse generator.

9. The adaptive pulse width control power conversion device as claimed in claim 7, wherein the load status detection circuit comprises an inductor current detection circuit connected to a node between the switching circuit and the filter circuit to detect an inductor current supplied to the load.

10. The adaptive pulse width control power conversion device as claimed in claim 7, wherein the load status detection circuit comprises a feedback circuit connected to a node between the filter circuit and the load to detect the output voltage supplied to the load.

* * * * *